US010852595B2

(12) United States Patent
Tezen et al.

(10) Patent No.: US 10,852,595 B2
(45) Date of Patent: Dec. 1, 2020

(54) DISPLAY DEVICE

(71) Applicant: Japan Display Inc., Tokyo (JP)

(72) Inventors: Tomoya Tezen, Tokyo (JP); Ken Sugiyama, Tokyo (JP); Kosuke Matsubara, Tokyo (JP); Koji Hiramoto, Tokyo (JP); Takeshi Kaneki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/249,568

(22) Filed: Jan. 16, 2019

(65) Prior Publication Data

US 2019/0219863 A1 Jul. 18, 2019

(30) Foreign Application Priority Data

Jan. 17, 2018 (JP) ................ 2018-005475

(51) Int. Cl.
| | |
|---|---|
| *G02F 1/1345* | (2006.01) |
| *G02F 1/1333* | (2006.01) |
| *H05K 1/18* | (2006.01) |
| *F21V 8/00* | (2006.01) |
| *H05K 1/02* | (2006.01) |
| *H05K 1/03* | (2006.01) |
| *G02F 1/00* | (2006.01) |

(52) U.S. Cl.
CPC .... *G02F 1/13452* (2013.01); *G02F 1/133308* (2013.01); *H05K 1/189* (2013.01); *G02B 6/005* (2013.01); *G02B 6/0066* (2013.01); *G02B 6/0083* (2013.01); *G02B 6/0091* (2013.01); *G02B 6/0093* (2013.01); *G02F 1/00* (2013.01); *G02F 1/133305* (2013.01); *H05K 1/0274* (2013.01); *H05K 1/0393* (2013.01); *H05K 1/181* (2013.01); *H05K 2201/10136* (2013.01)

(58) Field of Classification Search
CPC .................... G02F 1/133308; G02F 1/133305
See application file for complete search history.

(56) References Cited

U.S. PATENT DOCUMENTS

| | | | |
|---|---|---|---|
| 7,779,539 B2* | 8/2010 | Chen ...................... | H05K 1/118 29/402.09 |
| 2013/0169890 A1* | 7/2013 | Kuromizu ........... | G02F 1/13452 348/790 |
| 2015/0029436 A1* | 1/2015 | Nakayama .......... | G02F 1/13452 349/58 |

(Continued)

FOREIGN PATENT DOCUMENTS

| | | |
|---|---|---|
| JP | 2015-176680 A | 10/2015 |
| JP | 2016-207279 A | 12/2016 |

*Primary Examiner* — Dung T Nguyen
(74) *Attorney, Agent, or Firm* — K&L Gates LLP (57) ABSTRACT

According to one embodiment, a display device includes a display panel, a case including a bottom plate opposing a rear surface of the display panel and a side plate stand on the bottom plate and attached to the display panel, a flexible wiring board, one end of which is joined to the display panel, curved around the side plate toward the bottom plate to oppose the bottom plate while, and an adhesive filled between the flexible wiring board and the side plate of the case or between the flexible wiring board and both of the side plate and the bottom plate, to adhere the flexible wiring board onto an outer surface of the case and hold the flexible wiring board in a curved state.

9 Claims, 7 Drawing Sheets

(56) References Cited

U.S. PATENT DOCUMENTS

| | | | |
|---|---|---|---|
| 2015/0131024 A1* | 5/2015 | Sakamoto | G02F 1/13452 |
| | | | 349/58 |
| 2015/0260909 A1 | 9/2015 | Nambu et al. | |
| 2016/0306092 A1 | 10/2016 | Yoshida | |
| 2019/0018528 A1* | 1/2019 | Higano | G02F 1/136286 |
| 2019/0324311 A1* | 10/2019 | Yuminami | G02F 1/1339 |

* cited by examiner

DISPLAY DEVICE

CROSS-REFERENCE TO RELATED APPLICATIONS

This application is based upon and claims the benefit of priority from Japanese Patent Application No. 2018-005475, filed Jan. 17, 2018, the entire contents of which are incorporated herein by reference.

FIELD

Embodiments described herein relate generally to a display device.

BACKGROUND

Liquid crystal display devices, organic EL display devices and the like are widely used as a display device of smartphones, tablet computers, vehicle-navigation systems, etc. For example, a liquid crystal display comprises a liquid crystal display panel and a backlight device which illuminates the liquid crystal display panel. The backlight device comprises a case (or bezel) attached to the liquid crystal display panel, and various optical members disposed in the case. In the vicinity of input terminals of the liquid crystal display panel, a driver IC is mounted. A flexible printed circuit board (FPC) is joined to the liquid crystal display panel and electrically connected to the driver IC. The FPC extends outwards from the liquid crystal display panel and is bent, for example, onto a bottom surface side of the case to be disposed around a side surface and a rear surface of the case.

In recently years, the frame of the display devices is further narrowed. For example, the driver IC is mounted on the FPC and thus, with this structure, the driver IC conventionally mounted on the display panel can be removed, thereby achieving the narrowing of the frame. When a driver IC is mounted on an FPC, (which will be called COF hereinafter), the thickness of the base layer (for example, polyimide) of the FPC needs to be increased, to improve the mechanical strength of the COF. Therefore, the resilience (elastic restoring force) of COF against bending is stronger than that of the ordinary FPC. On the other hand, as the thinner of the display devices progresses, steep bending of the COF is required. Thus, the curvature of the bent portion of the COF tends to increase, and the resilient force of the COF tends to be further stronger. In the narrowing of the frame of the display device, it is required to suppress the resilient force of the COF.

SUMMARY

The present application relates generally to a display device.

According to one embodiment, a display device includes a display panel, a case including a bottom plate opposing a rear surface of the display panel and a side plate stand on the bottom plate and attached to the display panel, a flexible wiring board, one end of which is joined to the display panel, curved around the side plate toward the bottom plate while, and oppose the bottom plate while, and an adhesive filled between the flexible wiring board and the side plate of the case or between the flexible wiring board and both of the side plate and the bottom plate, to adhere the flexible wiring board onto an outer surface of the case and hold the flexible wiring board in a curved state.

DETAILED DESCRIPTION

Various embodiments will be described hereinafter with reference to the accompanying drawings. In general, according to one embodiment, a display device comprises a display panel, a case comprising a bottom plate opposing a rear surface of the display panel and a side plate stand on the bottom plate and attached to the display panel, a flexible wiring board, one end of which is joined to the display panel, curved around the side plate toward the bottom plate to oppose the bottom plate, and an adhesive filled between the flexible wiring board and the side plate or between the flexible wiring board and both of the side plate and the bottom plate, to adhere the flexible wiring board onto an outer surface of the case and hold the flexible wiring board in a curved state.

The disclosure is merely an example, and proper changes in keeping with the spirit of the invention, which are easily conceivable by a person with ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

Figure 1:
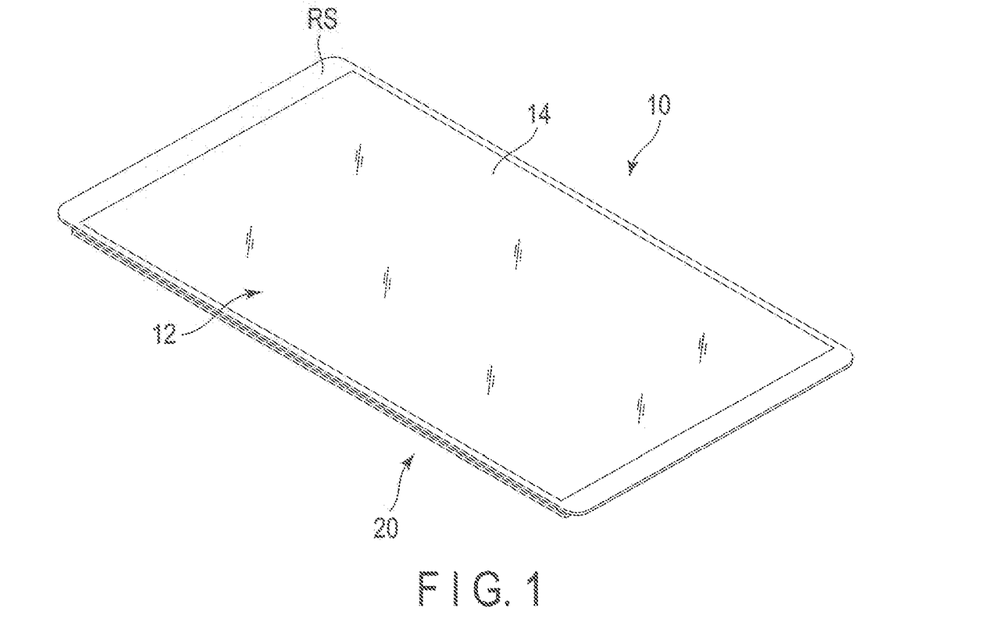
FIG. 1 is a perspective view showing a liquid crystal display device according to the first embodiment from a display surface side.
Figure 2:
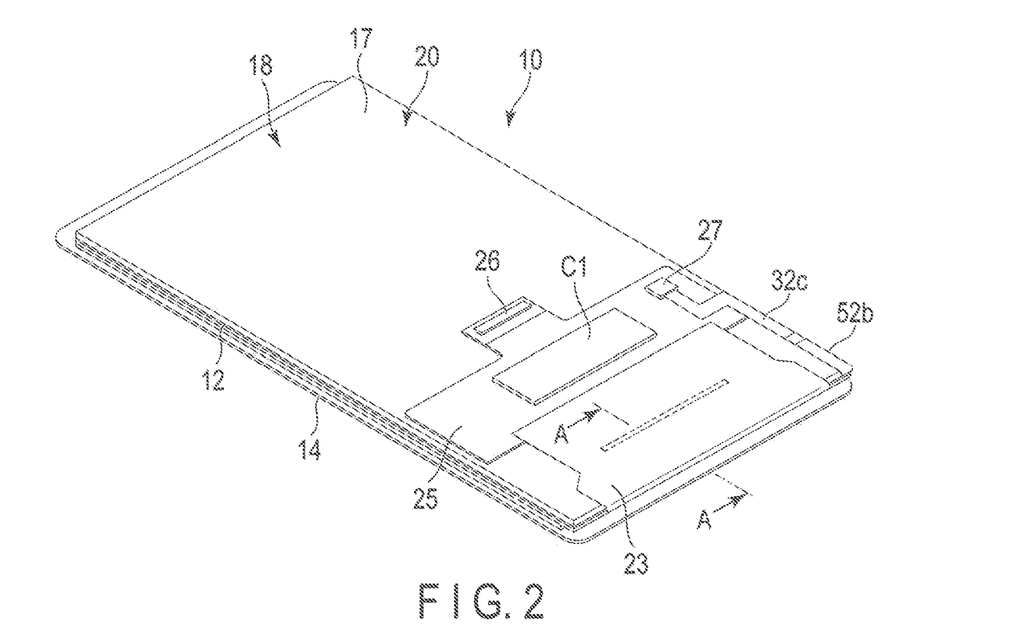
FIG. 2 is a perspective view showing the liquid crystal display device from a rear surface side.
Figure 3:
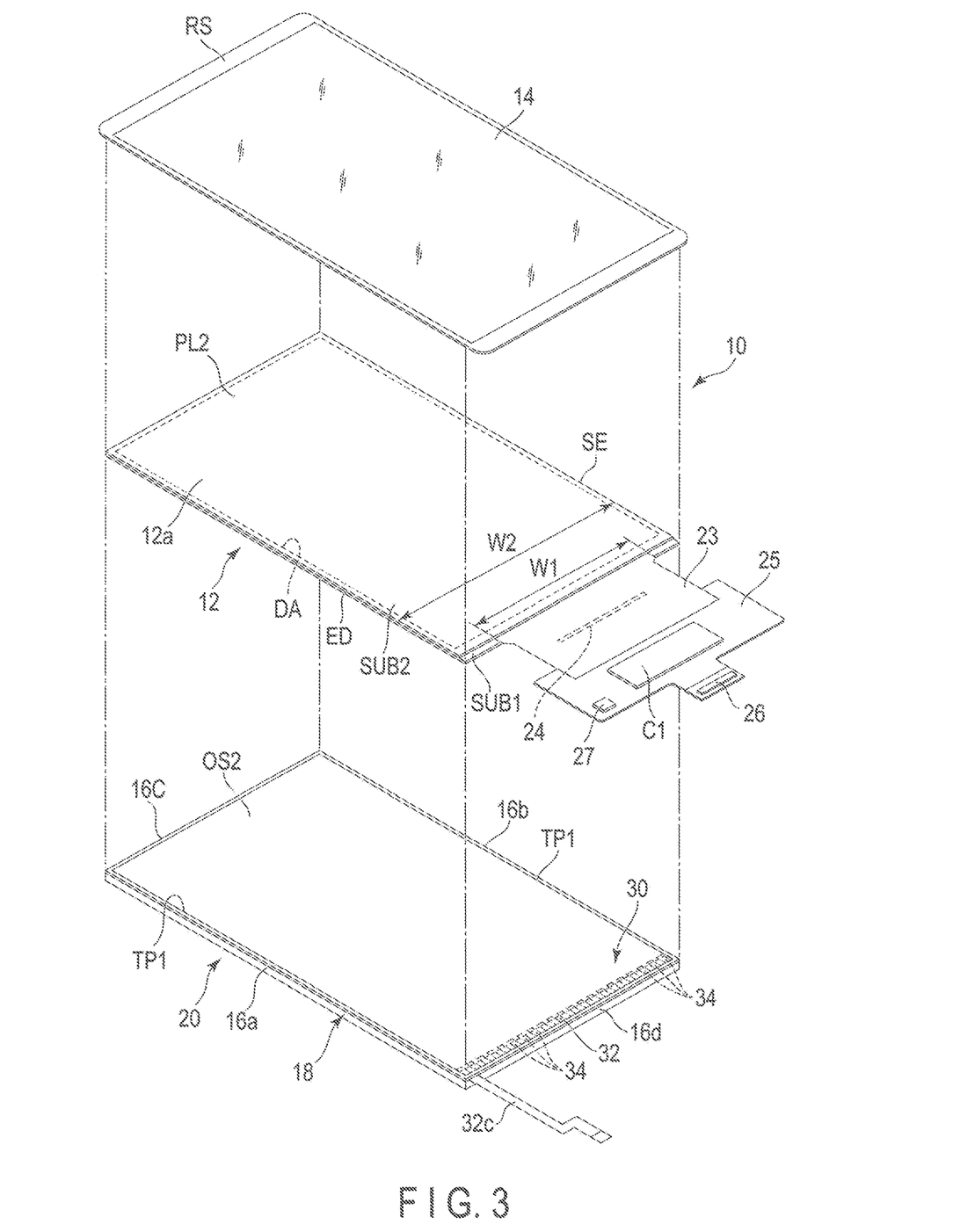
FIG. 3 is an exploded perspective view showing the liquid crystal display device.
Figure 4:
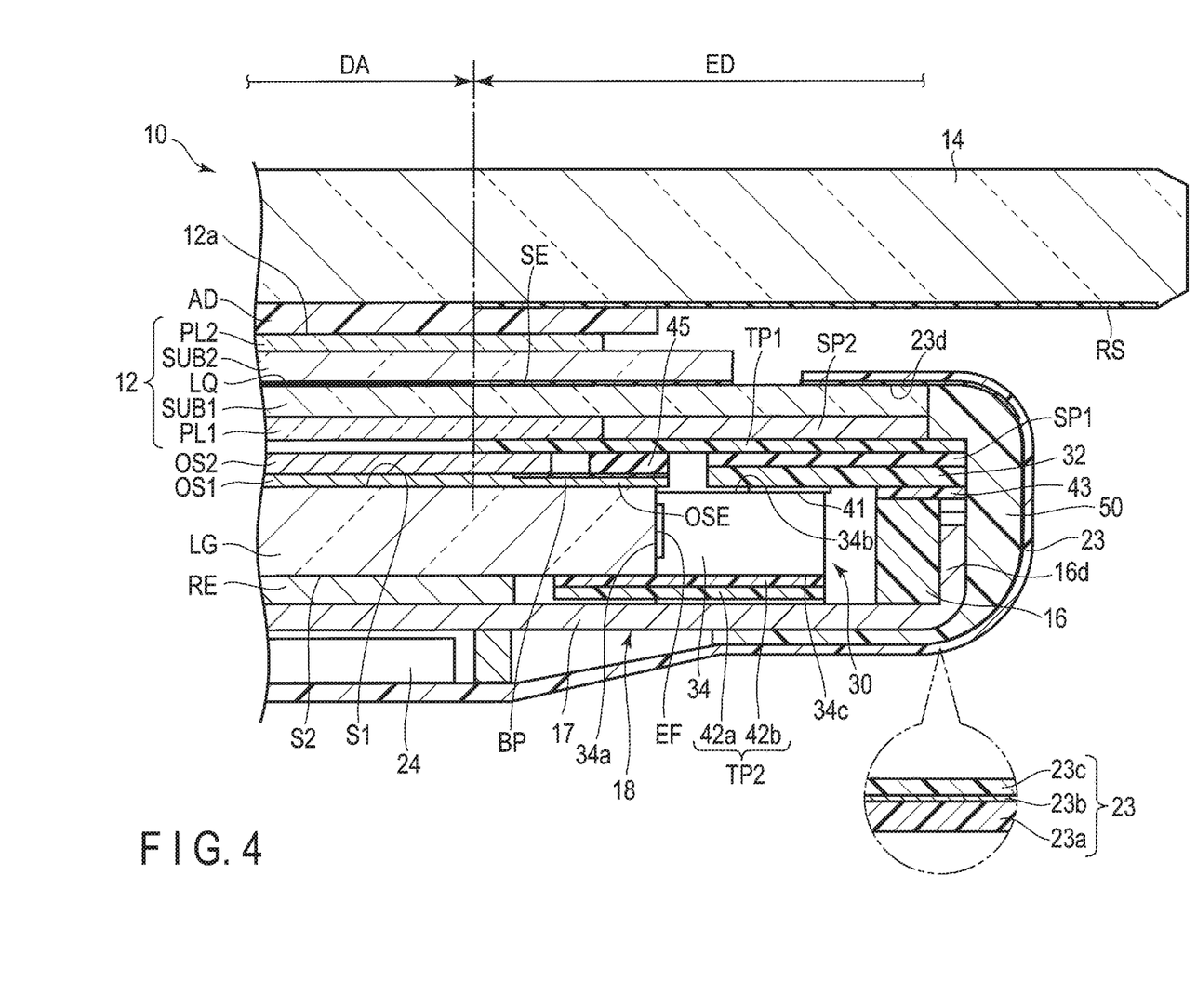
FIG. 4 is a cross sectional view showing a light source-side portion of the liquid crystal display device taken along line A-A of FIG. 2.

FIG. 1 is a perspective view of a liquid crystal display device according to a first embodiment from a display surface side. FIG. 2 is a perspective view of the liquid crystal display device viewed from a rear surface side. FIG. 3 is an exploded perspective view of the liquid crystal display device. FIG. 4 is a cross sectional view of a light source-side portion of the liquid crystal display device, taken along line A-A of FIG. 2.

A liquid crystal display 10 can be used, for example, to be built in various kinds of electronic devices such as smart phones, tablet devices, cellular phones, notebook personal computers, handheld game machines, electronic dictionaries, television sets and car-navigation systems.

As shown in FIGS. 1, 2 and 3, the liquid crystal display 10 comprises an active-matrix type liquid crystal display panel (display panel) 12, a cover panel 14 overlaid on a display surface 12a, which is one main surface of the display panel 12, to cover the entire display surface 12a, and a backlight unit (backlight device) 20 opposed to a rear surface, which is the other main surface of the display panel 12.

As shown in FIGS. 3 and 4, the display panel 12 comprises a rectangular-plate shaped first substrate SUB1, a rectangular-plate shaped second substrate SUB2 disposed to opposes the first substrate SUB1, and a liquid crystal layer LQ provided between the first substrate SUB1 and the second substrate SUB2. Each of the first substrate SUB1 and the second substrate SUB2 is formed of a transparent insulating substrate such as a glass plate or resin plate. The peripheral portion of the second substrate SUB2 is adhered to the first substrate SUB1 with a sealing member SE. A polarizer PL2 is adhered to the surface of the second substrate SUB2 and they form the display surface 12a of the liquid crystal display panel 12. A polarizer PL1 is adhered to the surface of the first substrate SUB1 (the rear surface of the liquid crystal display panel 12).

The display panel 12 comprises a rectangular display area (active region) DA in a region encircled by the sealing member SE in a state where the display surface 12a is seen in plan view (the state of viewing the display panel from the normal direction of the surface of the display panel, as so will be hereinafter). Images are displayed on the display area DA. A rectangular frame area (non-display area) ED is provided around the display area DA. The display panel 12 comprises a transmissive display function which displays images by selectively transmitting the light from the back light unit 20 through the display area DA.

As shown in FIGS. 1, 3 and 4, the cover panel 14 is formed, for example, from a glass or acrylic transparent resin, into a rectangular plate shape. In a peripheral portion of the rear surface of the cover panel 14 (a surface on a side of the display panel 12 or a surface on an opposite side to the surface opposing the observer), a frame-like light-shielding layer RS is formed. The rear surface (back surface) of the cover panel 14 is adhered onto the polarizer PL2 of the display panel 12 with a light-transmitting adhesives AD or tacking agent.

As shown in FIGS. 2, 3 and 4, the backlight unit 20 comprises a case 18, a plurality of optical members disposed in the case 18, and a light source unit 30 which supplies light entering the optical members. In this embodiment, the case 18 comprises a rectangular bottom plate 17, a plurality of side plates (16a to 16d) built to stand along side edges of the bottom plate 17, and a rectangular frame 16 provided in tight contact with these side plates. The frame 16 and the side plates include a pair of long side wall (long side plates) 16a and 16b opposing each other, and a pair of short side wall (short side plates) 16c and 16d opposing each other.

The frame 16 and the case 18 can be formed integrally as one body each from a resin or metal, or such a structure that one of these is made from a resin and the other is made from a metal can be adopted as well. In this embodiment, the bottom plate 17 and side plates 16a to 16d are formed from a metal such as stainless steel (SUS), and the frame 16 is formed from a resin. The frame 16 is integrated with the side plates by insertion molding or the like.

In this embodiment, the frame 16 is formed into a frame shape, but such a structure that the frame is provided only on a side of the pair of short sides of the backlight unit 20 can be adopted as well. Moreover, such a structure that the frame is provided on only one of the pair of short sides can be adopted as well.

As shown in FIGS. 3 and 4, the optical members of the backlight unit 20 each include a reflective sheet RE placed on the bottom plate 17 within the frame 16, a light guide LG, and a plurality of, for example, two, namely, a first optical sheet OS1 and a second optical sheet OS2, stacked on the light guide LG The reflective sheet RE is overlaid on the bottom plate 17 to cover substantially the entire surface of the bottom plate 17.

The light guide LG is formed from a light-transmitting resin, for example, an acrylic or silicon resin, in a rectangular shape, constituting a rectangular parallelepiped shape. The light guide LG includes a first main surface S1 functioning as an emission surface, a second main surface S2 on an opposite side to the first main surface S1, and a plurality of side surfaces that extend between the first main surface to the second main surface, respectively. In this embodiment, the side surface on one short side of the light guide LG is an incident surface EF.

The light guide LG is disposed in the frame 16 in the state that the second main surface S2 opposes the reflective sheet RE. The incident surface EF of the light guide LG opposes the side wall 16d of the frame 16 with a gap therebetween.

According to this embodiment, as the first optical sheets OS1, a diffusion sheet is employed, whereas a prism sheet is employed as the second optical sheets OS2. The optical sheets OS1 and OS2 are overlaid in this order on the first main surface S1 of the light guide LG The number of optical sheets is not limited to two, but may be three or more or may be one.

As shown in FIG. 4, the first optical sheet OS1 comprises a light source-side end (short side end) OSE. The end OSE is arranged to project from the light guide LG to the light source side over the incident surface EF of the light guide LG. A black printing BP is formed on an upper surface (surface by the side of the display panel 12) of the end OSE. The black printing BP is provided over an entire length of the short side of the first optical sheet OS1. Further, a belt-shaped light-shielding tape 45 is adhered and stacked on the black printing BP. With the black printing BP and the light-shielding tape 45, the end OSE of the first optical sheet OS1 is light-shielded, thereby suppressing leakage of light from the end OSE.

The light source unit (light source device) 30 will be described. As shown in FIGS. 3 and 4, the light source unit 30 comprises a belt-shaped flexible printed circuit board (FPC) 32 which functions as a wiring board, and a plurality of light sources mounted on the FPC 32. The FPC 32 has a length substantially equal to that of the short sides of the case 18. The FPC 32 comprises a connection end 32c (see FIGS. 2 and 3) extending from one side edge. The FPC 32 comprises a plurality of contact pads 41 and wiring lines (not shown), which are formed from a conductive layer.

In this embodiment, the light source has such a structure that light emitting elements, which are point light sources, for example, a plurality of light emitting diodes (LED) 34 are arranged at predetermined intervals. Each of the LEDs 34 comprises a case (enclosure) of substantially a rectangular parallelepiped shape. The case comprises a light-emitting surface 34a which emits light, a mount surface 34b normal to the light-emitting surface 34a, and a first side surface 34c normal to the light-emitting surface 34a and opposing the mount surface 34b. In each of the LEDs, the surface thereof one the side of the mount surface 34b is mounted on one surface of the FPC 32. The LEDs 34 are each mounted on the FPC 32 in the state that the end including the light-emitting surface 34a projects out from the side edge of the FPC 32.

The light source unit 30 is arranged in the case 18. The plurality of LEDs 34 are arranged in the case 18 between the incident surface EF of the light guide LG and the short side plate 16d. The light-emitting surface 34a of each LED 34 adjacently opposes the incident surface EF or contacts the incident surface EF. The FPC 32 is disposed along the side plate 16d, and one side edge of the FPC 32 is placed on the side plate 16d. The side edge may be attached onto the frame 16 with an adhesive tape 43 or the like. The connection end 32c of the FPC 32 extends outside the case 18 from one end of the side plate 16d (see FIGS. 2 and 3). A connection terminal 74 is provided in an extending end of the connection end 32c.

The first side surfaces 34c of each of the LEDs 34 is arranged to be substantially flush with the second main surface S2 of the light guide LG A fixing tape TP2 is adhered over the first side surface 34c and the second main surface S2. The LEDs 34 are fixed to the light guide LG with the fixing tape TP2, and are supported at respective predetermined positions. The fixing tape TP2 may be transparent or may be in black containing black ink or the like to have a light-shielding function.

As shown in FIGS. 3 and 4, the backlight unit 20 comprises a frame-shaped double-sided tape TP1. The double-sided tape TP1 is adhered on the frame 16. An outer circumferential edge of the double-sided tape TP1 coincides with an outer circumferential edge of the case 18. In a light source-side end of the case 18, the double-sided tape TP1 is adhered onto the FPC 32 via a spacer SP1, and it is further adhered onto a light-shielding tape 45.

The backlight unit 20 configured as above is attached to the display panel 12 with the double-sided tape TP1. An inner circumferential portion of the double-sided tape TP1 is adhered onto the polarizer PL1, and an outer circumferential portion is adhered onto the first substrate SUB1 while sandwiching a spacer SP2 therebetween. An outer circumferential edge of the backlight unit 20 coincides with an outer circumferential edge of the first substrate SUB1 except for the light source side. An side edge of the backlight unit 20 is located on slightly outer side of a respective side edge of the first substrate SUB1 on the light source side.

As shown in FIGS. 2 and 3, the liquid crystal display 10 includes flexible printed circuits (the main FPC and the flexible wiring board) joined to the display panel 12. In one short side of the first substrate SUB1, an exposed portion, which does not overlap the second substrate SUB2, is provided and a first end of the main FPC 23 is joined to an upper surface of the exposed portion. The main FPC 23 extends outward from one short side of the display panel 12. A width W1 of the first end of the main FPC 23 is less than a width W2 of the first substrate SUB1. The main FPC 23 extends in a direction normal to the short side of first substrate SUB1, for example. The connection end 32c of the light source unit 30 is in a longitudinal direction of the short side plate 16d away from the main FPC 23, without overlapping the main FPC 23.

On the main FPC 23, a semiconductor device such as the driver IC 24 or the like is mounted as a signal supply source which supplies a signal necessary to drive the display panel 12, (a structure in which the driver IC is mounted on such an FPC may be called "Chip On flexible printed circuit (COF)"). A sub-FPC 25 is joined to a second end of the main FPC 23. On the sub-FPC 25, a capacitor C1, connectors 26 and 27 and the like are mounted.

FIG. 4 includes a partially expanded cross section of the main FPC. As illustrated, the main FPC 23 comprises a belt-shaped base material (base layer) 23a, a conductive layer 23b formed on one surface of the base layer 23a and constituting a plurality of wiring lines, contact pads and the like, a protective layer 23c stacked on the conductive layer 23b and the base material 23a to cover the conductive layer 23b. The base layer 23a and the protective layer 23c are formed from, for example, a synthetic resin such as polyimide or polyurethane, and the conductive layer 23b is formed from an electric conduction metal layer, for example, of copper foil. The thickness of the main FPC 23 may vary from one location to another, and at the thickest location, for example, the thickness of the base layer is 35 μm and that of the entire structure is about 52 μm.

As shown in FIGS. 2 and 4, the main FPC 23 and the sub-FPC 25 are folded back around the short side of the first substrate SUB1, and disposed to be overlaid on the bottom plate 17 of the case 18. Similarly, the connection end 32c of the light source unit 30 is folded back around the short side of the substrate SUB1, and opposes the bottom plate 17. The connection terminal of the connection end 32c is connected to the connector 27 on the sub-FPC 25.

As shown in FIG. 4, the main FPC 23 is disposed in a state that the conductive layer 23b and protective layer 23c oppose or face the display panel 12 and the outer surface of the case 18. On the first end of the main FPC 23, a plurality of connection terminals 23d formed from a part of the conductive layer 23b, are provided. By thermocompression-bonding the first end of the main FPC 23 to the first substrate SUB1, the plurality of connection terminals 23d are electrically connected to a plurality of wiring lines or terminals of the first substrate SUB1, respectively. The driver IC 24 is mounted on the protective layer 23c side and is electrically connected to the wiring lines of the main FPC 23 through openings or contact pads (not shown) provided in the protective layer 23c. On the second end of the main FPC 23, a plurality of connection terminals (not shown) formed from a part of the conductive layer 23b are provided. By thermocompression-bonding the second end to the sub-FPC 25, the plurality of connection terminals are electrically connected to the sub-FPC 25.

In this embodiment, an adhesive 50 is filled between the main FPC 23 and the outer surface of the case 18. With the adhesive 50, the main FPC 23 is adhered to the end of the first substrate SUB1, the outer surface of the side plate 16d of the case 18, and the outer surface of the bottom plate 17 and also held in a curved state. Note that in view of the actual condition of the remarkably slimmed display device in the recently years, the state discussed in this embodiment, where the main FPC 23 is curved around the case 18 may be regarded to be equivalent to the state where the main FPC 23 is bent around the case 18. Therefore, the expression "curvature" used in this embodiment covers the bent state where an object is bent or folded, and similarly the expression "bending" also covers the curved state where an object is curved at such a great curvature that it can be as well regarded to be equivalent to "being bent".

The adhesive 50 is filled at least between the curved portion of the main FPC 23 and the outer surface of the case 18. More preferably, the adhesive 50 should be filled between the region near the curved portion and the outer surface of the case 18 as well. In this embodiment, the adhesive 50 is filled between the main FPC 23 and the outer surface of the case 18 to cover the corner portion which is the joint portion between the bottom plate 17 and a proximal end of the side plate 16d. Further, the adhesive 50 is filled even in the region opposing a part of the LED 34 while interposing the bottom plate 17 therebetween in plan view.

Although the thickness of the adhesive 50 vary depending on the degree of bending of the main FPC 23, in this embodiment, the thickness in the portion of adhesive 50 between the main FPC 23 and the bottom plate 17 is set to about 50 μm, whereas the thickness I the portion of the adhesive 50 between the main FPC 23 and the side plate 16d is set to about 300 μm.

As the adhesive 50, for example, a humidity hardening type adhesive, which hardens with humidity, for example, polyurethane reactive (PUR) is used. The adhesive 50, when hardens, should preferably have a hardness higher than or equivalent to that of the base material 23a of the main FPC 23e. Moreover, for example, according to a repulsion hardness test, the hardened adhesive 50 has a hardness of about D10 to 50.

Note that the hardness test here is by a durometer, Type D specified to JIS_K_6253.

With the hardened adhesive 50, the main FPC 23, the backlight unit 20 and the display panel 12 are integrated together, and therefore the repulsive force of the main FPC 23 produced by bending can be reduced. Thus, the curved state of the main FPC 23 can be reliably maintained.

Figure 5:
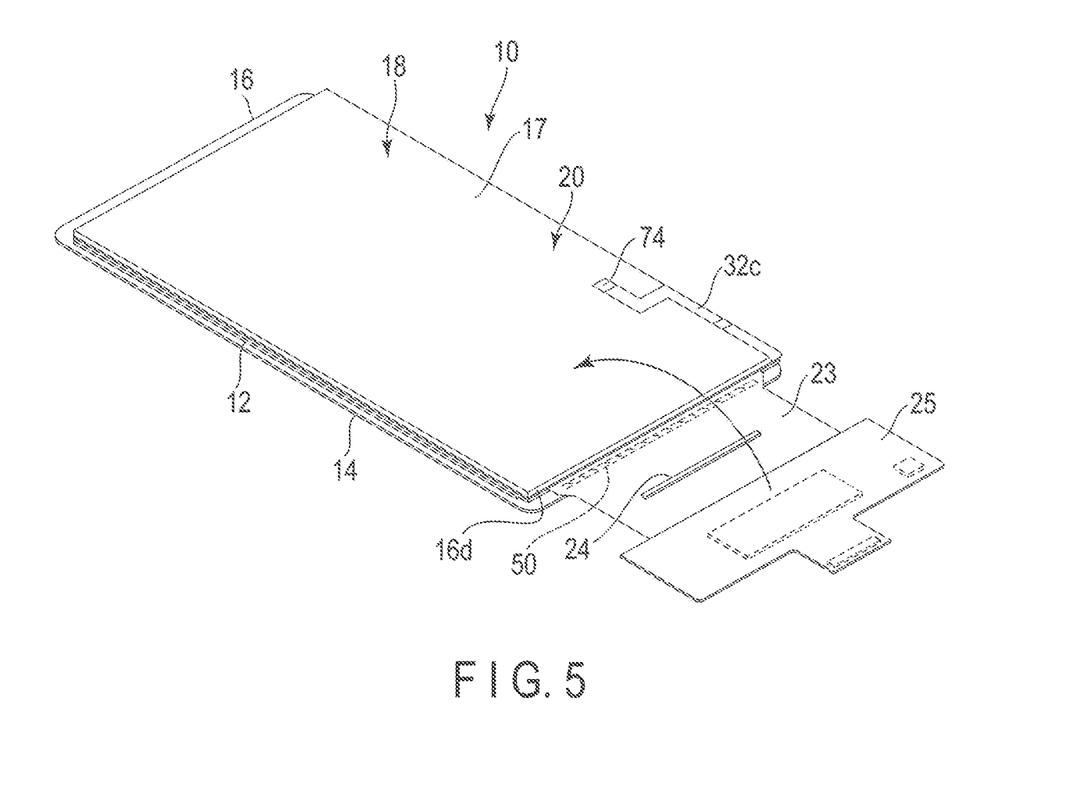
FIG. 5 is a perspective view showing the liquid crystal display in the state where the flexible wiring board is developed.

An example of the adhering method will be described. As shown in FIG. 5, while the main FPC 23 is developed, a predetermined amount of the adhesive 50 is applied on a protective layer side of the first end thereof. In this embodiment, the adhesive 50 is applied over substantially the full width of the main FPC 23. Subsequently, as indicated by an arrow in FIG. 5, the main FPC 23 is folded back to the bottom plate 17 side of the case 18, and placed to be overlaid on the bottom plate 17. Thus, the adhesive 50 is pushed by the main FPC 23 to spread, and as shown in FIG. 4, it is filled between the protective layer 23c of the main FPC 23, the end edge of the first substrate SUB1, the outer surface of the side plate 16d of the case 18 and the outer surface of the bottom plate 17 without creating any gap therebetween. Here, the main FPC 23 is bent and the thus formed curved state is maintained with an appropriate holder such as a clip, for a predetermined time, for example, about 1 hour to harden the adhesives 50. When the adhesive 50 hardens, the main FPC 23, the adhesive 50, the case 18, and the display panel 12 are integrated together as one structure, and the main FPC 23 is held at a curved state. After the hardening is completed, the holder is removed, thus finishing the adhering operation.

In the liquid crystal display 10 according to this embodiment, configured as described above, the main FPC 23 extending from the display panel 12 is folded back to the bottom plate 17 side around the side plate 16d of the case 18, thereby forming the curved portion. The main FPC 23 is adhered onto the outer surface of the case 18 with the adhesive 50 filled between the curved portion and the outer surface of the case 18. In other words, by filling with the adhesive 50, the main FPC 23 in the partially curved state is integrated with the case 18 and the display panel 12. Therefore, the adhesion by the adhesive 50 is stronger than the repulsive force produced by the main FPC 23 as it is being bent, the repulsive force (elastic restoring force) is suppressed by the adhesive 50. Further, the curved posture of the main FPC 23 is maintained over a long period of time, the repulsive force attenuates or becomes lost with time, thus making it possible to stably maintain the curved state of the main FPC 23 over a long period of time as a result. Further, since the repulsive force can be suppressed by the adhesion of the adhesive 50, the main FPC 23 can be bent as steeply as possible (the main FPC can be curved at a large curvature).

Further, the main FPC 23 is disclosed in such a direction that the protective layer 23c opposes the outer surface of the case 18, and further the adhesive 50 is filled between the protective layer 23c and the outer surface of the case 18. With this structure, the protective layer 23c and the conductive layer 23b of the main FPC 23 are not brought into contact directly with the corner portion of the case 18 or the corner portion of the display panel 12. Therefore, even when the main FPC 23 is bent steeply, a damage such as breaking of wiring lines of the main FPC 23 due to contact with the corner portion can be prevented.

As described above, according to the first embodiment, the repulsive force in the curved portion of the flexible printed circuit board can be sufficiently suppressed and the carved state of the flexible printed circuit board can be stably held.

Note that in the first embodiment, the liquid crystal display panel 12 is used for the display panel of the display device, but the display panel is not limited to this. For example, an organic electroluminescence display panel may be used as well. In this case, a backlight unit is not necessary, and the case 18 or the bottom plate 17, which is a part of the case 18 may be disposed on a rear surface side of the organic electroluminescence display panel as a support member. Moreover, the adhesive 50 is not limited to the humidity hardening type, but any adhesive may be used as long as it satisfies required conditions.

Next, a display device according to another embodiment will be described. In the embodiment described below, structural parts identical to those of the first embodiment described above will be designated by the same reference numbers, and detailed descriptions therefor may be omitted or simplified. Only the different portions from those of the first embodiment will be mainly described in detail.

Second Embodiment

Figure 6:
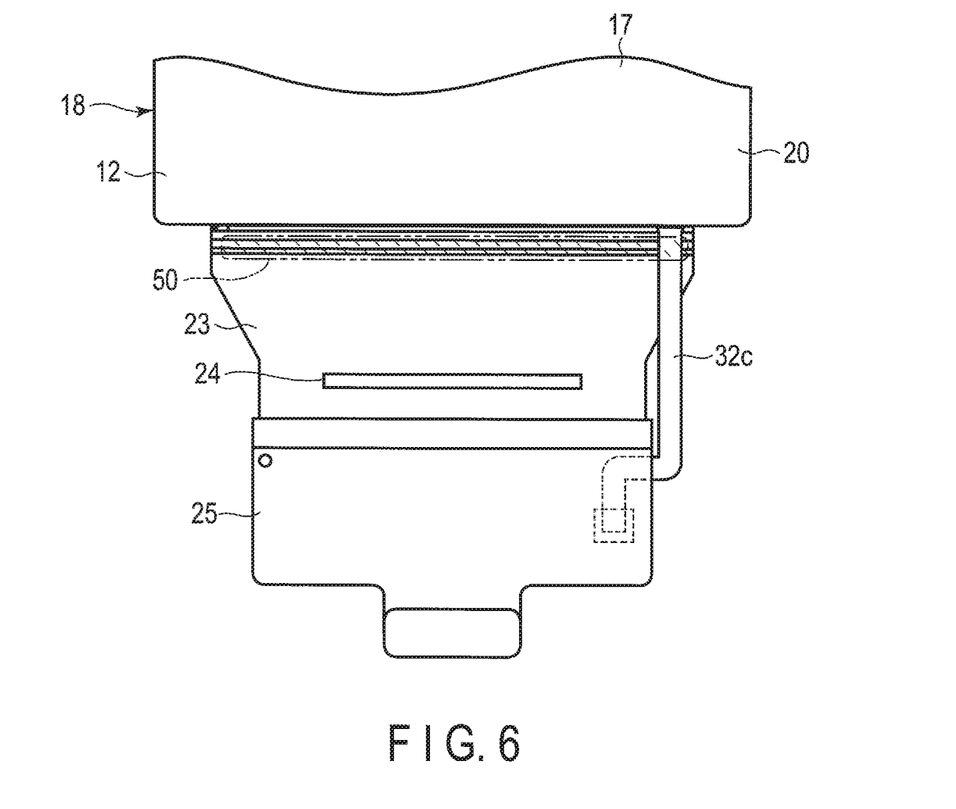
FIG. 6 is a plan view schematically showing a part of a liquid crystal display device according to the second embodiment.
Figure 7:
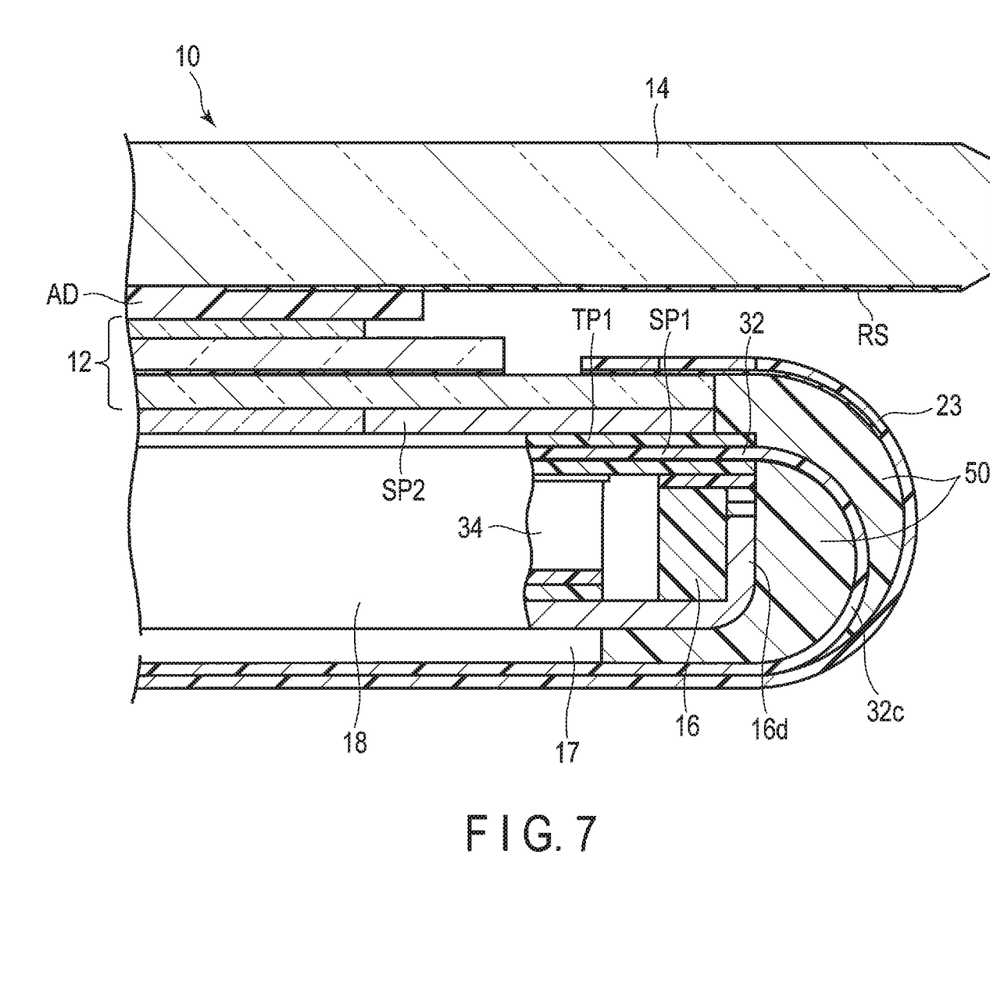
FIG. 7 is a cross sectional view showing a light source-side end of the liquid crystal display device of the second embodiment.

FIG. 6 is a plan view schematically showing a liquid crystal display device according to a second embodiment when a main FPC thereof is developed. FIG. 7 is a cross sectional view showing a light source-side end of the liquid crystal display device of the second embodiment.

As shown in FIG. 6, according to the second embodiment, a connection end 32c of a light source device 30 is displaced to a central portion from one end of a side plate 16d of a case 18. With this structure, a part of the connection end 32c is located to overlap one end of a main FPC 23s in its thickness direction. In this case, as indicated by a dashed line in FIG. 6, an adhesive 50 is applied onto one end of the main FPC 23, and a portion thereof is applied over the connection end 32c.

As shown in FIG. 7, the main FPC 23 and the connection end 32c are folded back to a bottom plate 17 side around the side plate 16d of the case 18. The adhesive 50 is filled between the main FPC 23 and the outer surface of the case 18. With the adhesive 50, the main FPC 23 is adhered onto an end edge of a first substrate SUB1, an outer surface of the side plate 16d of the case 18 and an outer surface of the bottom plate 17, and is held at a bent state and a curved state. The connection end 32c is disposed in a curved state between the main FPC 23 and the outer surface of the case 18, and is embedded in the adhesive 50. That is, the adhesive 50 is filled between the connection end 32c and the main FPC 23 and between the connection end 32c and the outer surface of the case 18. Thus, with the adhesive 50, the connection end 32c is adhered onto the outer surface of the side plate 16d of the case 18 and the outer surface of the bottom plate 17, and is held in a bent state and a curved state.

Note that the adhesive 50 used here is a humidity hardening type as in the first embodiment. In the second embodiment, the other structures of the liquid crystal display device are the same as those of the liquid crystal display device according to the first embodiment.

According to the second embodiment configured as above, with the adhesive 50, the connection end 32c of the light source device can be stably held in the curved state, in addition to the curved state of the main FPC 23. Further, also in the second embodiment, advantages similar to those of the above-described first embodiment can be obtained.

First Modified Example

Figure 8:
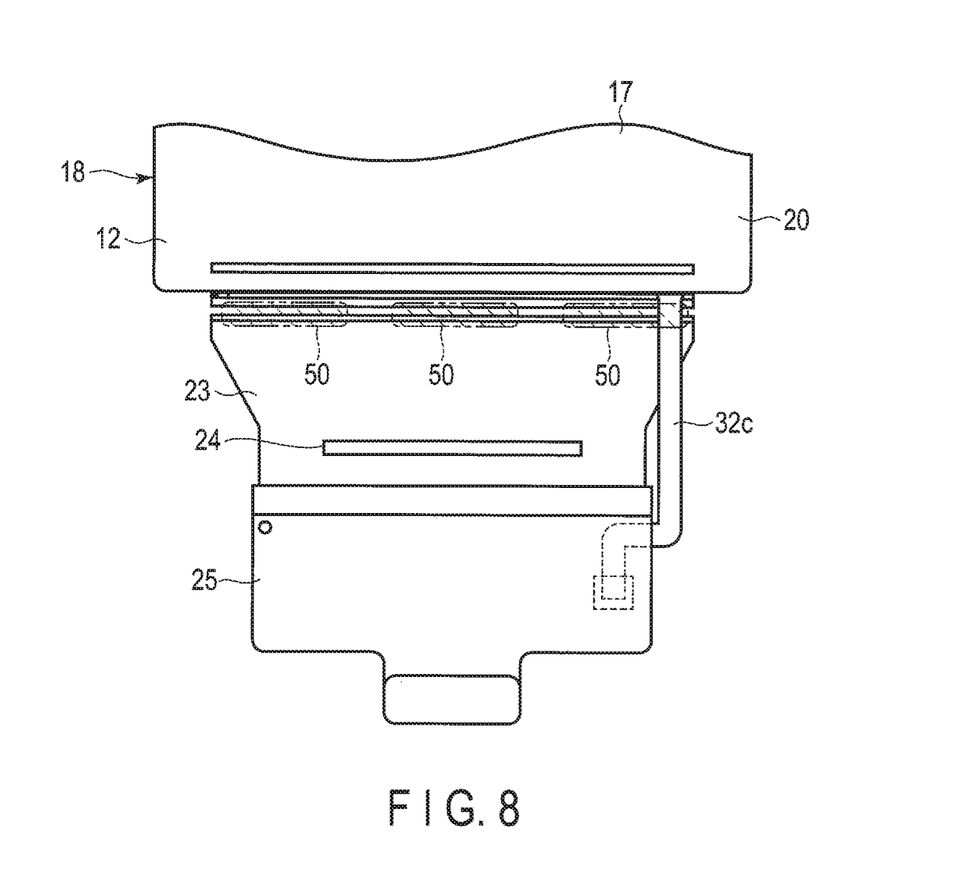
FIG. 8 is a plan view schematically showing a part of a liquid crystal display device according to the first modified example.

According to the structure of the first and second embodiments, the adhesive 50 is filled over substantially a full length of the main FPC 23 in its width direction, but the structure is not limited to this. For example, as shown in FIG. 8, the adhesive 50 may as well be applied and filled intermittently to a plurality of places in the width direction of the main FPC 23. Or, the adhesive 50 may also as well be filled selectively in regions where the repulsive force of the main FPC 23 is specifically strong.

While certain embodiments and modified examples have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Based on the structures which have been described in the above-provided embodiments and modification, a person having ordinary skill in the art may achieve structures with arbitral design changes; however, as long as they fall within the scope and spirit of the present invention, such structures are encompassed by the scope of the present invention. For example, the structural members of the liquid crystal panel and the backlight device and the outer and inner shapes of the frame are not limited to rectangular, but one or both of the outer and inner shapes may be in some other shape, for example, polygonal, circular, elliptical, a combination of any of these or the like when seen in plan view. The liquid crystal display devices are not limited to a flat shape but may be partially or entirely curved or inclined. The materials of the structural members are not limited to those of the examples provided above, but may be selected from various options.

Furthermore, regarding the present embodiments, any other advantages and effects which would be obvious from the description of the specification or arbitrarily conceived by a skilled person are naturally considered achievable by the present invention.

What is claimed is:

1. A display device comprising:
a display panel with an end portion;
a case comprising a bottom plate opposing a rear surface of the display panel and a side plate stand on the bottom plate and attached to the display panel;
a flexible wiring board, one end of which is joined to the end portion of the display panel, curved around the side plate toward the bottom plate to oppose the bottom plate; and
an adhesive contacted with both the flexible wiring board and the end portion of the display panel and filled between the flexible wiring board and the side plate or between the flexible wiring board and both of the side plate and the bottom plate, to adhere the flexible wiring board onto an outer surface of the case and hold the flexible wiring board in a curved state.

2. The display device of claim 1, wherein
the flexible wiring board comprises a base layer, a conductive layer provided on the base layer and forming a plurality of wiring lines, and a protective layer covering the conductive layer, and
the flexible wiring board is disposed with the protective layer opposing to the outer surface of the case.

3. The display device of claim 2, wherein
the base layer is formed from a resin containing polyimide, and the adhesive is of a humidity hardening type which hardens with humidity.

4. The display device of claim 1, wherein
the adhesive is filled to a region including a corner between the bottom plate and the side plate.

5. The display device of claim 1, wherein
the adhesive is filled between the flexible wiring board and the outer surface of the case over a full length of the flexible wiring board in a width direction thereof.

6. The display device of claim 1, wherein
the adhesive is filled between the flexible wiring board and the outer surface of the case intermittently in a width direction of the flexible wiring board.

7. The display device of claim 1, further comprising:
a backlight device comprising the case, a light guide disposed in the case and opposing the display panel, and a light source unit arranged in the case and configured to enter light to the light guide, and
wherein
the light source unit comprises a wiring board including a connection end and a light source mounted on the wiring board and opposing the light guide, and the connection end extends outwards from the case.

8. The display device of claim 7, wherein
the connection end extends between the flexible wiring board and the outer surface of the case, and is embedded inside the adhesive.

9. A display device comprising:
a display panel with an end portion;
a bottom plate opposing a rear surface of the display panel;
a flexible wiring board, one end portion of which is joined to the end portion of the display panel, extending from the display panel and curved around a side of the bottom plate toward the bottom plate to oppose the bottom plate; and
an adhesive contacted with both the flexible wiring board and the end portion of the display panel and filled between the flexible wiring board and the bottom plate, to adhere the flexible wiring board onto an outer surface of the bottom plate and hold the flexible wiring board in a curved state.

\* \* \* \* \*